United States Patent [19]

Ruby

[11] Patent Number: 5,061,686
[45] Date of Patent: Oct. 29, 1991

[54] SUPERCONDUCTING POWER DISTRIBUTION STRUCTURE FOR INTEGRATED CIRCUITS

[75] Inventor: Richard C. Ruby, Menlo Park, Calif.

[73] Assignee: Hewlett-Packard Company, Palo Alto, Calif.

[21] Appl. No.: 352,221

[22] Filed: May 15, 1989

[51] Int. Cl.[5] .................. H01G 1/14; H01G 4/10; H01L 27/02; H01B 12/00
[52] U.S. Cl. ........................ 565/1; 361/306; 361/321; 357/51
[58] Field of Search ............. 361/306, 321; 505/1; 357/51; 437/51

[56] References Cited

U.S. PATENT DOCUMENTS

| | | | |
|---|---|---|---|
| 2,665,376 | 1/1954 | Kodama | 361/321 |
| 3,184,661 | 5/1965 | Weller et al. | 361/306 X |
| 3,864,817 | 2/1975 | Lapham et al. | 357/51 X |
| 4,205,364 | 5/1980 | Pereira | 361/321 |
| 4,451,845 | 5/1984 | Philofsky et al. | 357/51 X |
| 4,482,933 | 11/1984 | Alexander | 361/321 |
| 4,599,677 | 7/1986 | Lawless et al. | 361/321 |
| 4,626,958 | 12/1986 | Lockard et al. | 361/306 |
| 4,638,400 | 1/1987 | Brown et al. | 357/51 X |
| 4,654,694 | 3/1987 | Val | 357/51 X |
| 4,758,922 | 7/1988 | Ishigaki et al. | 361/321 |
| 4,799,127 | 1/1989 | Ono et al. | 361/321 |
| 4,800,459 | 1/1989 | Takagi et al. | 361/321 |
| 4,814,289 | 3/1989 | Baeuerle | 357/51 X |
| 4,872,086 | 10/1989 | Huang et al. | 361/321 |

FOREIGN PATENT DOCUMENTS 39016 2/1989 Japan .................. 361/321 C

*Primary Examiner*—Donald A. Griffin

[57] ABSTRACT

A superconducting power distribution structure for integrated circuits characterized by a support member and a relatively thin superconducting capacitor member. Vias extending through the support member and the capacitor member couple power and ground plates of the capacitor member to power and ground traces on the circuit board. The vias are solder-bump connected to an integrated circuit chip, and the entire chip is cryogenically cooled to cause the plates of the capacitor to superconduct. The superconducting capacitor provides a large reservoir of charge to the integrated circuit chip through minimal inductance and with minimal voltage drop across its power plane.

31 Claims, 3 Drawing Sheets

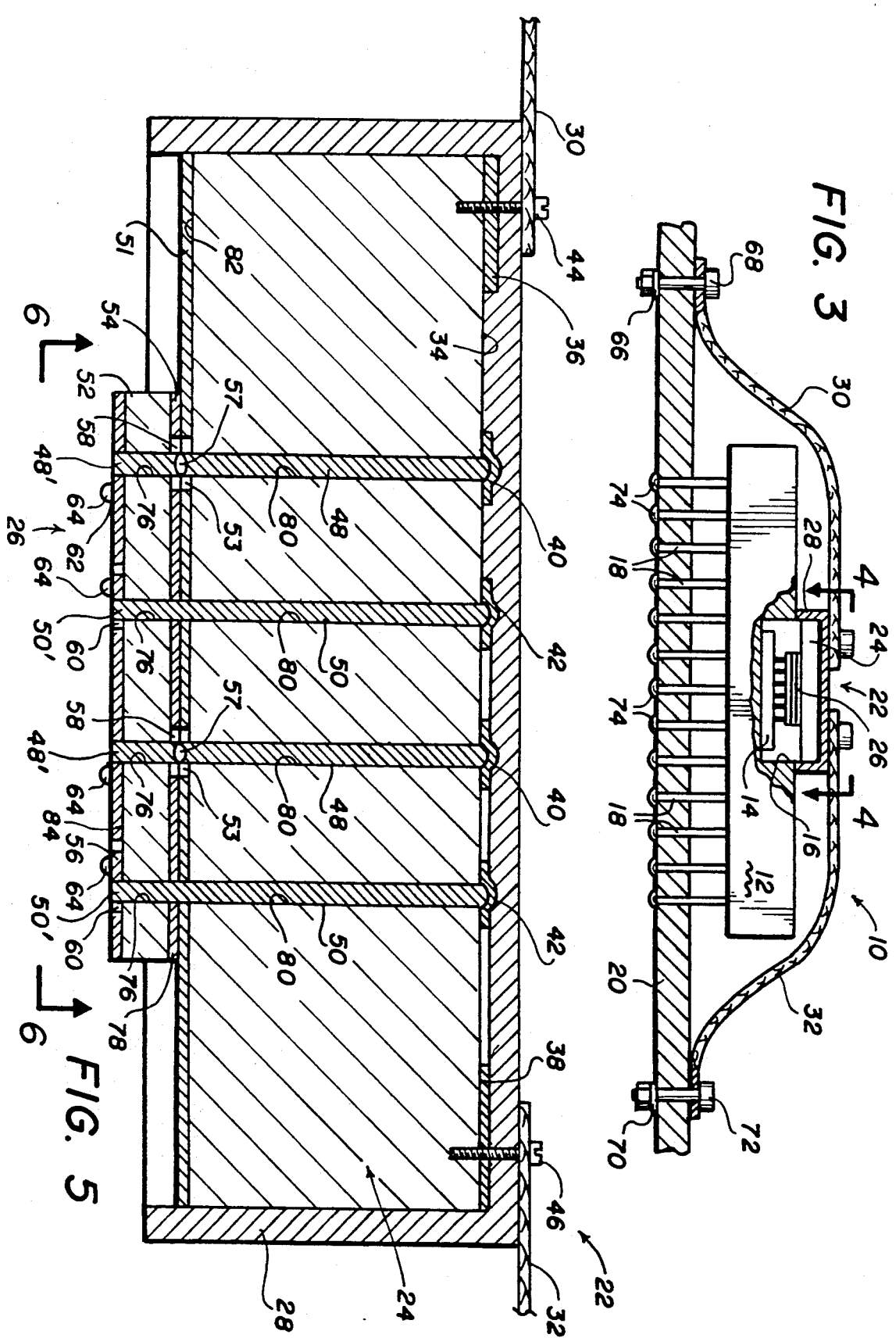

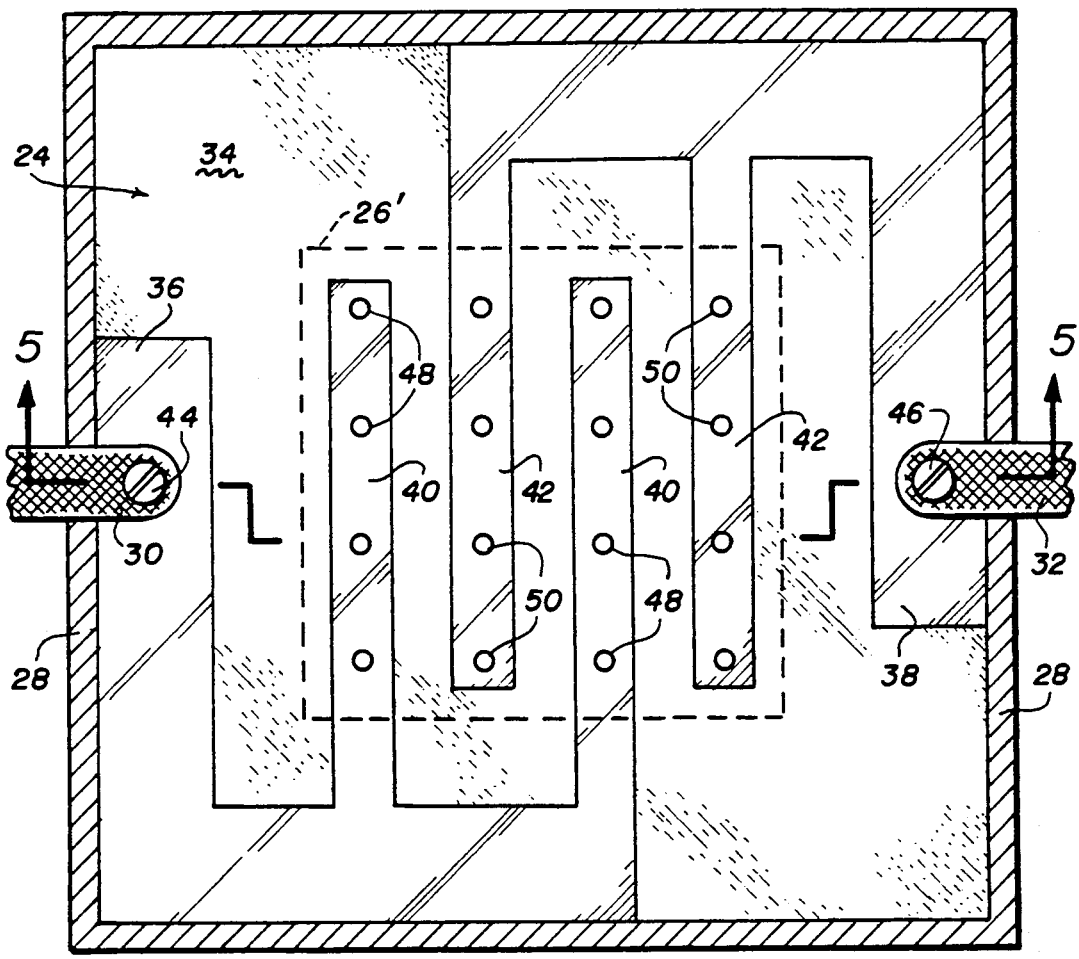
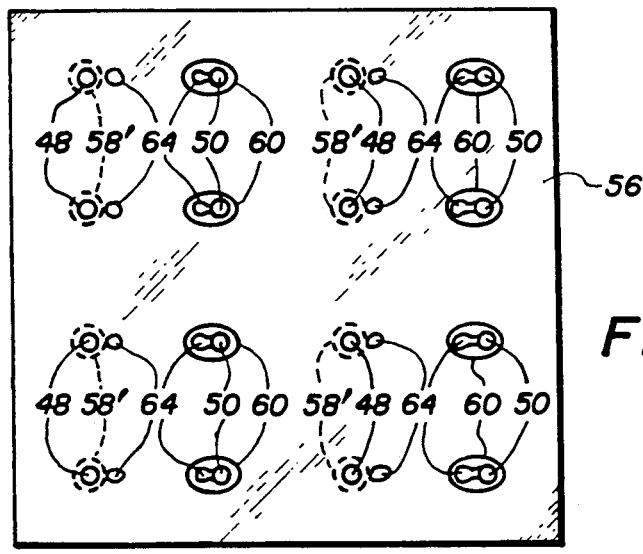

SUPERCONDUCTING POWER DISTRIBUTION STRUCTURE FOR INTEGRATED CIRCUITS

BACKGROUND OF THE INVENTION

1. Field of the Invention

This invention relates generally to integrated circuits, and more particularly to integrated circuit packaging and interconnections.

2. Description of the Related Art

As seen in FIG. 1, a typical digital electronic circuit includes a number of digital integrated circuits, such as IC1 and IC2, and discrete active or passive components such as capacitor C. The various components of the digital circuit are coupled together by means of a printed circuit board P having a number of conductive traces (such as traces T1 and T2) formed along one or more surfaces of the board.

When operating digital circuits at high speeds there is the problem of supplying charge quickly enough to the rapidly switching devices of the integrated circuits. This problem can be partially ameliorated by placing a capacitor between power and ground near each integrated circuit package to serve as a local charge storage device. However, at very high switching speeds even a large capacitor placed very close to an integrated circuit package cannot supply charge sufficiently rapidly to the devices within the integrated circuit. This is due to tiny inductances in the leads of the capacitor and the integrated circuit, the connecting traces, etc. which create substantial electrical impedance at high operating frequencies.

FIG. 2 is a schematic representation of the circuit of FIG. 1. IC1 includes a transmitter, i.e. a device which sends signals off-chip, while IC2 includes a receiver of those signals. The IC1 transmitter includes a driver D1 and the IC2 receiver includes a driver/receiver D2. Inductors L1 and L2 represent the lead inductances of capacitor C and inductance L3 represents the inductance of the power plane between the power lead of capacitor C and the power lead of IC1. Inductances L5, L6 and L9 are the inductances of leads to the integrated circuit IC1 for power, ground, and signal output, respectively. The transmission line (X-LINE) of the model corresponds to the trace T2 coupling IC1 to IC2, while the inductances L8 and L10 are lead capacitances for integrated circuit IC2. Resistor $R_t$ is a termination resistance which matches the impedance of the X-LINE. Finally, inductances L7 and L4 are the inductances of the ground path from IC2 to the capacitor ground lead.

When driver D1 is activated, a typical current path is as follows: L1→L3→L5→L9→X-LINE→L8→$R_t$→L10→L7→L4→L2→C. The total inductance of the loop is then L1+L3+L5+L9+L8+L10+L7+L4+L2, which is often several nanohenrys. Since the expression for current in an inductive circuit is given by $i = V/R \times e^{-tR/L}$, an increase in inductance will increase the time constant L/R of the circuit, thereby reducing the speed at which the circuit can be operated.

Another problem with high speed operation is that the voltage at $V_{HI}$ (node 1) will drop by the amount $L \times dI/dt$ where dI is the change in current and dt is the turn-on time of the driver. For digital bipolar circuits, dI is approximately 20 milliamperes and dt is approximately 0.5 nanoseconds. The drop $dV_{max}$ allowable at node 1 is typically 200 millivolts or less. The $dV_{max}$ puts an upper limit on L, i.e. $L \leq = dV_{max} \times 1/(dI/dt)$ or, in the present example, L must be less than or equal to approximately 5 nanohenrys. If only one driver on IC1 were to switch at a time, this upper limit for L can be easily satisfied. However, it is not unusual for an IC to have 200 drivers, requiring the total inductance to be less than or equal to 5 nh/200 or 25 picohenrys in the worst-case scenario where all of the drivers switch simultaneously. This is difficult or impossible to achieve with conventional packaging and interconnecting technologies.

Another problem with prior art structures is that of providing the proper ground and power potentials to the various components within an integrated circuit. Since most TTL integrated circuits operate at 5 volts, a voltage drop of as little as one volt along a power plane can cause components of the integrated circuit to behave erratically and unpredictably. This problem has been addressed in the prior art by increasing the area and/or thickness of the power plane. The unfortunate trade-offs of this prior art solution are increased manufacturing costs and lowered circuit density.

SUMMARY OF THE INVENTION

The present invention addresses the above-described problems of the prior art by providing a superconducting capacitor which is coupled, in flip-chip fashion, to an underlying integrated circuit. One of the plates of the capacitor serves as a ground plane, while the other plate serves as the power plane. Vias extend through the capacitor from the plate farthest from the integrated circuit, and solder bumps connect the vias and the other capacitor plate to the integrated circuit. There is no voltage drop across the plates because the plates of the capacitor are superconducting.

A method for producing the superconductor capacitor structure of the present invention utilizes high $T_c$ ceramic superconductors such as $Y_1Ba_2Cu_3O_{(7-x)}$, which will hereafter be referred to as YBaCuO. The method includes the steps of forming a number of via holes in a strontium titanate ($SrTiO_3$) dielectric substrate; depositing a superconductive material such as YBaCuO on a first surface of the dielectric and within the via holes to form vias; patterning the superconductor material on the first surface to isolate some of the vias; forming via holes in a second dielectric (which is also preferably made from $SrTiO_3$); depositing a superconducting material on both sides of the second dielectric and within its via holes to form vias; patterning the superconductor material on one side of the second dielectric to isolate some of the vias; coupling the patterned surfaces of the two dielectrics together; reducing the thickness of the first dielectric; depositing a superconductor material on a second surface of the first dielectric; and patterning the second surface of the first dielectric to isolate some of the vias. Typically, solder bumps are provided on the second surface of the first dielectric to couple the superconducting capacitor to an integrated circuit.

An advantage of this invention is that the inductance between an integrated circuit and its associated capacitor is greatly minimized. More specifically, and with reference to FIG. 2, the inductances L1, L2, L3, L4, L5 and L10 are greatly reduced vis-a-vis the prior art.

An advantage of using a superconducting capacitor is that it greatly increases the local charge reservoir for the integrated circuit. It is also advantageous in that the superconductor capacitor plates serve as constant voltage level local ground and power planes, providing all devices of the integrated circuit with substantially the same voltage levels.

These and other objects and advantages of the present invention will become apparent to those skilled in the art after reading the following descriptions and studying the various figures of the drawing.

BRIEF DESCRIPTION OF THE DRAWINGS

FIG. 3 is a partially broken, cross-sectional view of an integrated circuit and printed circuit board assembly in accordance with the present invention;

FIG. 4 is a top plan view taken along line 4—4 of FIG. 3;

FIG. 5 is a cross-sectional view taken along line 5—5 of FIG. 4; and

FIG. 6 is a bottom plan view taken along line 6—6 of FIG. 5.

DETAILED DESCRIPTION OF THE PREFERRED EMBODIMENTS

Figures 1, 2:
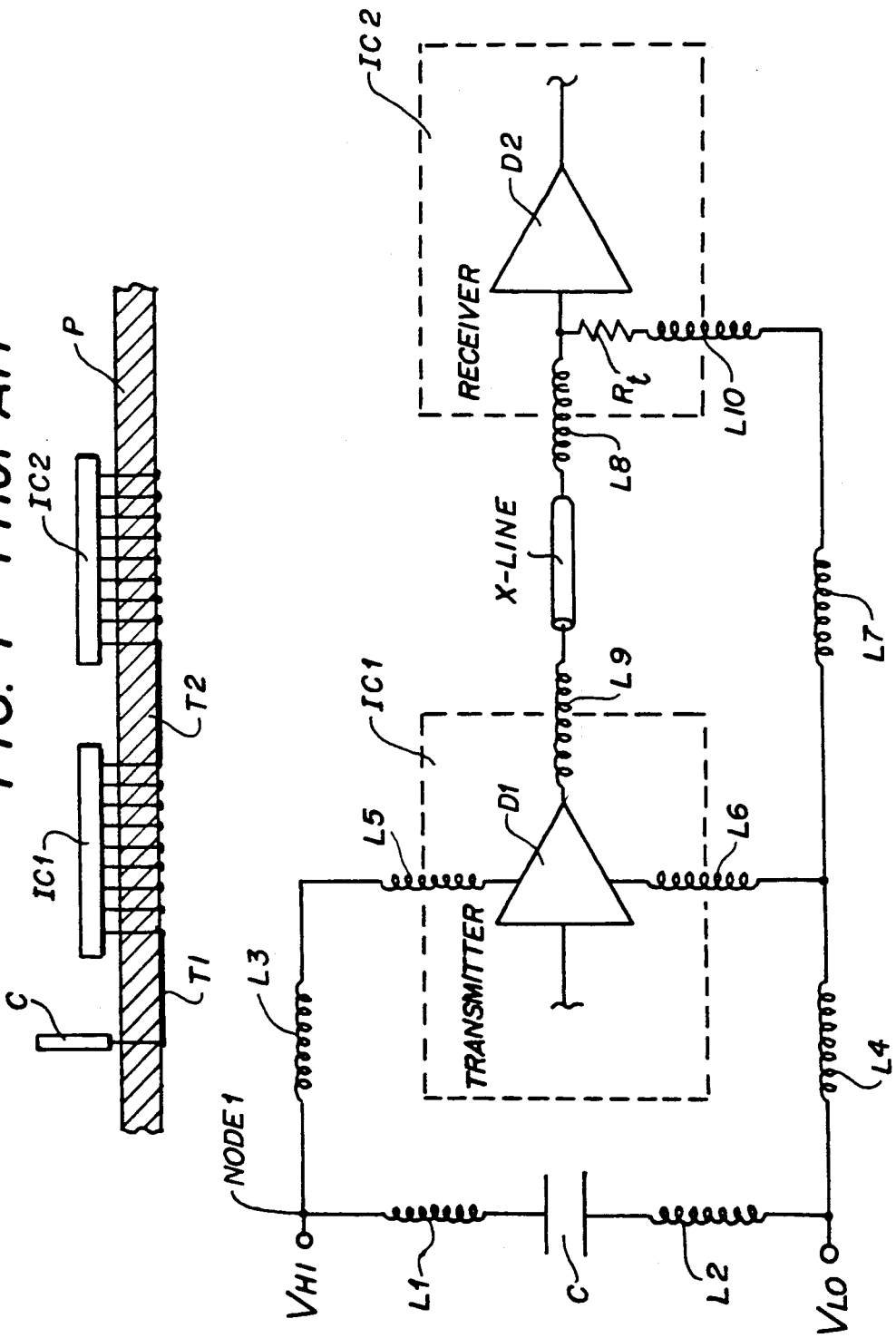
FIG. 1 is a cross-sectional view of a prior art integrated circuit and printed circuit board assembly.
FIG. 2 is a schematic representation of the prior art integrated circuit and printed circuit board assembly of FIG. 1.

In FIG. 3, an integrated circuit structure 10 in accordance with the present invention includes an integrated circuit package 12, and integrated circuit chip 14 disposed within a recess 16 of package 12, a number of leads 18 coupling the integrated circuit chip 14 to a PC board 20, and a power distribution structure 22. The power distribution structure 22 includes a support member 24, a capacitor member 26, an IC package cap 28, a power strap 30, and a ground strap 32. The power distribution structure 22 serves to provide power and ground potentials to the integrated circuit chip 14.

Referring to the enlarged top plan view of FIG. 4, the upper surface 34 of support member 24 is provided with a power trace 36 and a ground trace 38. The outline of the capacitor member 26 is shown at 26'. The power trace 36 includes several fingers 40 which are interspaced with several fingers 42 of ground trace 38. Power trace 36 is coupled to power strap 30 by a fastener 44, and ground trace 38 is coupled to ground strap 32 by a fastener 46. Alternatively, spring loaded clamps with contact solder bumps can press against pads on power trace 36 and ground trace 38 to make power and ground connections. Indium, mercury, or gallium can be used to coat the solder bump surfaces to provide enhanced mechanical and electrical interfaces.

With additional reference to FIG. 5, a number of power vias 48 and a number of ground vias 50 extend through the support member 24. The power vias 48 contact the fingers 40 of power trace 36, and the ground vias 50 contact the fingers 42 of ground trace 38. The capacitor member 26 includes a dielectric member 52, a first capacitor plate 54, and a second capacitor plate 56. The power vias 48 and ground vias 50 extend through the dielectric member 52 by power and ground vias 48' and 50', respectively. Solder bumps 57 (optionally with staggered launches, not shown) can be used to facilitate the coupling between power vias 48 and 48'. Similar solder bumps can facilitate the connection between ground vias 50 and 50', if desired. Isolation rings 58 are provided in the first capacitor plate 54 to isolate the power vias 48/48', and isolation rings 60 are provided in second capacitor plate 56 to isolate the ground vias 50'. The power vias 48' are directly coupled to the second capacitor plate 56 (which becomes the power plate) and the ground vias 50/50' are directly coupled to the first capacitor plate 56 (which becomes the ground plate). Each of the power vias 48' and ground vias 50' are associated with a solder bump 64 which is preferably slightly offset from the vias in a staggered launch, for reasons well known to those versed in solder bump technology.

Referring now to the bottom plan view of FIG. 6, the isolation rings 60 in the second capacitor plate 56 can be more clearly seen. The isolation rings 58 in the first capacitor plate 54 are shown in broken lines at 58'. As mentioned above, the isolation rings 58 electrically isolate power vias 48 from the first capacitor plate 54 and the isolation rings 60 electrically isolate ground vias 50 from the second capacitor plate 56.

In operation, the power strap 30 is coupled to a power trace 66 on PC board 20 with a fastener 68 (FIG. 3), and ground strap 32 is coupled to a ground trace 70 by a fastener 72. The leads 18 extending from the IC package 12 are soldered to various conductive traces 74 on the PC board 20. With reference to FIG. 5, the power will flow through the power strap 30 to the power trace 36, and from there to fingers 40 and vias 48/48'. Therefore, the second capacitor plate 56 will be at $V_{HI}$ potential. Similarly, first capacitor plate 48 will be at ground potential due to is coupling to vias 50/50', fingers 42, ground trace 38 and ground strap 32. The solder bumps 64 are used to couple the capacitor member 26 to the IC chip 14 in a conventional flip-chip, solder-bump manner.

Due to this novel power distribution structure 22, the inductance coupling the capacitor member 26 to the IC chip 14 is greatly reduced. More specifically, and with reference to FIG. 2, the inductances L1, L2, L, L4, L5 and L10 are greatly minimized on comparison to the prior art structure shown in FIG. 1.

The materials of the dielectrics, plates, traces, vias, etc. can also be made of conventional materials. For example, the support member 24 and the dielectric member 52 can be made from a fiberglass material, while the traces 36 and 38, vias 48 and 50, and capacitor plates 54 and 56 can be made from a conventional conductor such as copper. Even with these conventional materials, the structure of the present invention is advantageous in providing a ground plane, a power plane, and a large charge source very close to the integrated circuit structure. However, it has been discovered that if at least some of the conductive members of the power distribution structure 22 are made from a superconductor such as $Y_1Ba_2Cu_3O_{(7-x)}$ ("YBaCuO") and if at least some of the dielectric members of the power distribution structure are made from strontium titanate ($SrTiO_3$) major additional improvements are made in the circuit performance.

One immediate improvement in using a superconductor material, such as YBaCuO, for the capacitor plates 54 and 56 is that there are no voltage drops along the power and ground planes due to resistance losses. Therefore, all components of the integrated circuit chip 14 receive the same power and ground levels, and a source of substandard integrated circuit performance is eliminated.

The use of strontium titanate for the dielectric 52 has a number of advantages. First, strontium titanate has so far proven to be the best substrate material for the growth of the high $T_c$ material YBaCuO. Second, strontium titanate is one of a class of polar materials which have dielectric values which are inversely proportional to temperature. In consequence, strontium titanate has a very high dielectric value of approximately 30,000 at liquid nitrogen temperatures. Using the formula $C=(e_o \cdot e_r a)/d$ where "$e_o$" is a constant, "$e_r$" is the dielectric constant of strontium titanate at liquid nitrogen temperatures, "a" is the area of the capacitor plate, and "d" is the thickness of the dielectric, it can be calculated that strontium titanate has a capacity of approximately one microfarad/cm$^2$ for a 1 mil. thick substrate. Since the charge Q is given by Q=CV, this large capacitance C translates to a higher storage value Q. As explained previously, this large charge storage is quickly available to the IC chip 14 due to the low inductance coupling between the power distribution structure 22 and the IC chip.

Yet another advantage of strontium titanate as the dielectric is that it has an associated loss which increases directly with frequency. This has the advantageous effect of dampening any high frequency transients across the power and ground planes, which could disrupt the normal operation of the integrated circuit. In consequence, the present structure takes on the characteristics of an "ideal" power/ground plane, where the power/ground rails of an integrated circuit are often assumed to be lossless to d.c. but lossy to high frequency transients.

Strontium titanate has a relatively low loss tangent which, for many purposes, is desirable. However, as was mentioned above, a larger loss tangent might be desirable for such purposes as high frequency dampening. It is well known in the art that a slight oxygen doping will produce the desired increase in the loss tangent of strontium titanate.

A method for producing the suppot member 24 portion and the capacitor member 26 portion of the power distribution structure 22 will now be discussed. Again, these members can be constructed from a number of conventional or superconducting materials, although if constructed from superconducting materials, they will demonstrate enhanced properties.

With reference to FIG. 5, dielectric 52 is provided with a number of via holes 76. These via holes can be produced by mechanical or power beam drilling, or can be created in the dielectric member during its formation. It should be noted that, in the early part of the processing, the dielectric member 52 is considerably thicker than it is depicted in FIG. 5 to prevent damage to the dielectric member.

Next, the YBaCuO is deposited on a first surface 78 of the dielectric member 52 to create the first capacitor plate 54 and within via holes 76 to form vias 48' and 50'. The first surface 78 is then patterned to form the isolation rings 58. The deposition of the superconductor to the surface 78 can be accomplished by a number of techniques including spraying, dipping, painting, or thermospraying. The patterning of the first capacitor plate 56 can be accomplished by a number of conventional techniques, including standard photolithography processes used in printed circuit board and integrated circuit manufacture.

Next, via holes 80 are formed through support member 24, which is also preferably made from strontium titanate. Superconducting YBaCuO is then deposited on both upper surface 34 and lower surface 82 of support member 24, and within the via holes 80 to form the vias 48 and 50. This superconductor material is patterned on top and bottom to form the power trace 36 and ground trace 38 on the top, and the isolation rings 53 and the connection plane 51.

The connection plane 51 and first capacitor plate 54 are then placed together with the isolation rings 53 and 58 in alignment, and the vias 48/48' and 50/50' are fused together to form an integral unit. The dielectric member 52 is then greatly reduced in thickness to increase the capacitance of the capacitor member 26. Superconductor material is next deposited on a lower surface 84 of the dielectric member 52 and patterned with isolation rings 60. Finally, solder bumps 64 are provided to permit good contact and connection to the IC chip 14.

Once the support member 24 portion and the capacitor member 26 portion have been assembled, they can be placed within cap 28 and then flip-chip bonded to pads on IC chip 14 (see FIG. 3). Power strap 30 and ground strap 32 are then coupled to the power and ground on the PC board 20 to complete the power distribution structure. Of course, the entire integrated circuit structure 10 needs to be cooled below the transition temperature $T_c$ of the superconductive material in order to cause the capacitor member 26 to superconduct. This can be accomplished by simply immersing the entire PC board 20 within a reservoir of liquid nitrogen.

While this invention has been described with reference to several preferred embodiments, it is contemplated that various alterations and permutations thereof will become apparent to those skilled in the art upon a study of the specifications and drawings. It is therefore intended that the scope of this invention be determined by the following appended claims.

What is claimed is:

1. A superconducting power distribution structure for an integrated circuit comprising:
    a first superconducting capacitor plate;
    a second superconducting capacitor plate provided with electrical isolation means within said second capacitor plate;
    dielectric means separating said first capacitor plate from said second capacitor plate;
    first via means coupled at a first end to said first capacitor plate and extending through said dielectric and said electrical isolation means of said second capacitor plate;
    first contact means coupled to a second end of said first via means; and
    second contact means coupled to said second capacitor plate such that said first contact means and said second contact means are accessible from the same side of said second capacitor plate.

2. A superconducting power distribution structure as claimed in claim 1 wherein said first capacitor plate is provided with electrical isolation means within said first capacitor plate and further comprising second via means extending through said dielectric means and said electrical isolation means of said first capacitor plate and having a first end coupled to said second capacitor plate.

3. A superconducting power distribution structure as claimed in claim 2 further comprising support means proximately coupled to said first plate and distally from said second plate.

4. A superconducting power distribution structure as claimed in claim 3 wherein said first via means and said second via means extend through said support means.

5. A superconducting power distribution structure as claimed in claim 4 further comprising first contact means coupling said first via means together and second contact means coupling said second via means together.

6. An integrated circuit structure comprising:
an integrated circuit chip provided with a first plurality of contacts along a first surface thereof, wherein at least one of said first plurality of contacts is an internal contact;
capacitor means provided with a second plurality of contacts along a first surface thereof, said capacitor means and said integrated circuit chip being juxtaposed such that said first surface of said integrated circuit means faces said first surface of said capacitor means;
connection means for coupling said first plurality of contacts to said second plurality of contacts;
unitary packaging means enclosing both said integrated circuit chip and said capacitor means to isolate them from the ambient environment, said unitary packaging means including external connection means; and
means for coupling at least some of said first plurality of contacts to said external connection means but excluding said at least one internal contact.

7. An integrated circuit structure as claimed in claim 6 wherein said capacitor means includes a second surface spaced from said first surface, a dielectric located between said first surface and said second surface, and at least one via extending between said first surface and said second surface, where said at least one via has an end coupled said second surface and has another end which extends through an electrical isolation means provided in said first surface.

8. An integrated circuit structure as claimed in claim 7 wherein said at least one via is one of a first plurality of vias, where at least one other via is coupled at one end to said first surface and has another end which extends through an isolation means provided in said second surface.

9. An integrated circuit structure as claimed in claim 8 further comprising support means having a first surface and a second surface, where a first surface of said support means is proximately coupled to said second surface of said capacitor means and distally to said first surface, said support means being further provided with a second plurality of vias extending between said first surface and said second surface thereof and coupled to said first plurality of vias.

10. An integrated circuit structure as claimed in claim 9 further comprising power distribution means contacting at least one of said second plurality of vias, and ground distribution means contacting at least one of said second plurality of vias.

11. An integrated circuit structure as claimed in claim 7 wherein said first surface and said second surface of said capacitor means superconduct when cooled below a critical temperature.

12. A method for making a power distribution structure for an integrated circuit comprising the steps of:
forming a first plurality of via holes in a first dielectric;
depositing a conductive material on a first surface of said first dielectric and within said first plurality of via holes;
patterning said conductive material on said first surface of said first dielectric to isolate at least some of said first plurality of via holes;
forming a second plurality of via holes in a second dielectric;
depositing a conductive material on both a first surface and a second surface of said second dielectric and within said second plurality of via holes;
patterning said conductive material on said first surface of said second dielectric to isolate at least some of said second plurality of via holes;
coupling said first surface of said first dielectric to said first surface of said second dielectric, and said first plurality of vias to said second plurality of vias;
reducing the thickness of said first dielectric;
depositing a conductive material on a second surface of said first dielectric; and
patterning said conductive material on said second surface of said first dielectric to isolate at least some of said first plurality of via holes.

13. A method as claimed in claim 12 wherein said conductive material on said first surface and said second surface of said first dielectric is a superconductor material.

14. A method as claimed in claim 12 further comprising the step of forming conductive contact means on ends of said first plurality of vias proximate said second surface of said first dielectric.

15. A method as claimed in claim 12 further comprising the step of patterning the conductive material on said second surface of said second dielectric such that some of said second plurality of vias may be coupled to a power contact, and others of said second plurality of vias may be coupled to a ground contact.

16. An integrated circuit structure comprising:
integrated circuit chip means provided with a first plurality of bondable power and ground contacts along a same surface thereof;
capacitor means provided with a conductive first surface, a conductive second surface, a dielectric disposed between said first and second surfaces, and a second plurality of bondable contacts formed proximate said first surface, where each of said second plurality of contacts is coupled to one of said first and second surfaces, said capacitor means and said integrated circuit chip means being juxtaposed such that said surface of said integrated circuit chip means faces and is closely proximate said first surface of said capacitor means with said first plurality of contacts being in direct contact with and bonded to said second plurality of contacts, whereby said chip means and said capacitor means are attached together in a flip-chip fashion.

17. An integrated circuit structure as recited in claim 16 wherein said first surface and said second surface are made from a superconductor material which is superconducting at temperatures below a critical temperature.

18. An integrated circuit structure as recited in claim 17 wherein said superconductor material is a copper-oxide based superconductor.

19. An integrated circuit structure as claimed in claim 18 wherein said dielectric is a polar material.

20. An integrated circuit structure as claimed in claim 18 wherein said dielectric includes strontium titanate.

21. An integrated circuit structure as claimed in claim 20 wherein said strontium titanate is doped essentially with oxygen to increase its loss tangent.

22. A power distribution structure for an integrated circuit comprising:

a first capacitor plate;

a second capacitor plate provided with an opening;

dielectric means separating said first capacitor plate from said second capacitor plate;

first via means coupled at a first end to said first capacitor plate and extending through said dielectric and through said opening in said second capacitor plate;

first contact means coupled to a second end of said first via means; and second contact means coupled to said second capacitor plate.

23. A power distribution structure as claimed in claim 22 wherein said first capacitor plate is provided with an opening and further comprising second via means extending through said dielectric and through said opening in said first capacitor plate, said second via means having a first end coupled to said second capacitor plate.

24. A power distribution structure as claimed in claim 23 further comprising support means coupled to said first plate.

25. A power distribution structure as claimed in claim 24 wherein said first via means and said second via means extend through said support means.

26. A power distribution structure as claimed in claim 25 further comprising first contact means coupling said first via means together and second contact means coupling said second via means together.

27. A power distribution structure as claimed in claim 26 wherein said first capacitor plate and said second capacitor plate are made from a material which superconducts when cooled below a critical temperature.

28. A superconducting power distribution structure for an integrated circuit comprising;

a first superconducting capacitor plate including a copper-oxide based superconductor;

a second superconducting capacitor plate including a copper-oxide based superconductor, said second capacitor plate being provided with electrical isolation means within said second capacitor plate;

dielectric means separating said first capacitor plate from said second capacitor plate;

first via means coupled at a first end to said first capacitor plate and extending through said dielectric and said electrical isolation means of said second capacitor plate;

first contact means coupled to a second end of said first via means; and second contact means coupled to said second capacitor plate.

29. An integrated circuit structure as claimed in claim 28 wherein said dielectric is a polar material.

30. An integrated circuit structure as claimed in claim 29 wherein said dielectric includes strontium titanate.

31. An integrated circuit structure as claimed in claim 30 wherein said strontium titanate is doped with oxygen to increase its loss tangent.

* * * * *